United States Patent
Yamaguchi et al.

[11] Patent Number: 6,118,154
[45] Date of Patent: *Sep. 12, 2000

[54] INPUT/OUTPUT PROTECTION CIRCUIT HAVING AN SOI STRUCTURE

[75] Inventors: Yasuo Yamaguchi; Hirotoshi Sato; Yasuo Inoue; Toshiaki Iwamatsu, all of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/947,345

[22] Filed: Oct. 8, 1997

Related U.S. Application Data

[63] Continuation of application No. 08/745,136, Nov. 7, 1996, abandoned.

[30] Foreign Application Priority Data

Mar. 29, 1996 [JP] Japan ................................ 8-076305

[51] Int. Cl.[7] .................................................. H01L 23/60
[52] U.S. Cl. .......................................... 257/360; 257/356
[58] Field of Search ................................... 257/360, 361, 257/356, 357

[56] References Cited

U.S. PATENT DOCUMENTS

| | | | |
|---|---|---|---|
| 3,555,374 | 1/1971 | Usuda | 257/356 |
| 4,282,556 | 8/1981 | Ipri | 257/360 |
| 4,745,450 | 5/1988 | Hartranft et al. | 257/360 |
| 4,893,159 | 1/1990 | Suzuki et al. | 257/356 |
| 4,989,057 | 1/1991 | Lu . | |
| 5,440,161 | 8/1995 | Iwamatsu et al. | 257/349 |
| 5,510,728 | 4/1996 | Huang | 257/357 |
| 5,610,426 | 3/1997 | Asai et al. | 257/360 |
| 5,841,172 | 11/1998 | Morishita et al. | 257/355 |

FOREIGN PATENT DOCUMENTS

| | | |
|---|---|---|
| 0349890A2 | 1/1990 | European Pat. Off. . |
| 4341170A1 | 6/1995 | Germany . |
| 61-133655 | 6/1986 | Japan . |
| 3-91264 | 4/1991 | Japan . |
| 4-105357 | 4/1992 | Japan . |
| 4-233758 | 8/1992 | Japan . |
| 4-365373 | 12/1992 | Japan . |
| 7-335894 | 12/1995 | Japan . |

OTHER PUBLICATIONS

Mansun Chan et al, "SOI/Bulk Hybrid Technology on SIMOX Wafers for High Performance Circuits with Good ESD Immunity", IEEE Electron Device Letters, vol. 16, No. 1, Jan. 1995, pp. 11–13.

Primary Examiner—Gene M. Munson
Attorney, Agent, or Firm—McDermott, Will & Emery

[57] ABSTRACT

An I/O protection circuit includes a P-channel MOS transistor connected between an input terminal and a power supply line, and an N-channel MOS transistor connected between the input terminal and a ground line. Gate electrodes of both the transistors are floated. The transistors may be replaced with gate diodes. Further, gate electrodes may be formed from the same layer as a gate electrode provided for field shielding.

21 Claims, 17 Drawing Sheets

INPUT/OUTPUT PROTECTION CIRCUIT HAVING AN SOI STRUCTURE

This application is a continuation of application Ser. No. 08/745,136 filed Nov. 7, 1996, abandoned.

BACKGROUND OF THE INVENTION

1. Field of the Invention

The present invention relates to an I/O (Input/Output) protection circuit, and particularly to an I/O protection circuit in a semiconductor device provided with SOI (Silicon-on-Insulator) field-effect transistors.

2. Description of the Background Art

In an MOS device on a bulk silicon substrate, surge can be discharged to a substrate via a p-n junction. However, in an SOI device having MOS transistors and others formed on an insulating layer, surge cannot be discharged to a substrate, because the substrate is electrically isolated by an insulating layer. Particularly, in a thin-film SOI structure having a source region and a drain region which extend to a buried oxide film (insulating layer), it is necessary to discharge the surge laterally, because a vertical junction is not present. Therefore, the surge is discharged laterally through a power supply line or a ground line via a diode or an MOS transistor.

FIG. 17 is a circuit diagram showing an example of a conventional input protection circuit. Referring to FIG. 17, the input protection circuit is connected between an input terminal 30 and an internal circuit 31, and includes a rush resistor 36, an internal resistor 37, and diodes 38 and 39.

FIG. 18 is a circuit diagram showing an inverter which is a typical example of internal circuit 31. Referring to FIG. 18, the inverter includes a P-channel MOS transistor 44 and an N-channel MOS transistor 45. In this example, the protection circuit shown in FIG. 17 is connected to an input node 72 of an inverter so as to protect the inverter against a surge applied through input terminal 30.

The protection circuit may be connected to an output node 73 of the inverter. In this case, the protection circuit protects the inverter against a surge applied through output node 73, and therefore is called an output protection circuit. The input protection circuit and the output protection circuit are generally called an I/O circuit.

An I/O protection circuit shown in FIG. 17 will be described below. When a surge due to static electricity is applied through input terminal 30, rush resistor 36 first delays the surge and prevents rapid application thereof to diodes 38 and 39. The surge passed through rush resistor 36 is applied to a signal line 71. Further, the surge is rapidly discharged to power supply line 32 by diode 38 and to ground line 33 by diode 39. Here, internal resistor 37 does not flow the surge toward internal circuit 31, but flows the same toward diodes 38 and 39.

When a positive high voltage surge is applied, a p-n junction of diode 39 breaks down, and the surge is discharged to ground line 33. At the same time, diode 38 is biased forward, and the surge is discharged to power supply line 32. Meanwhile, when a negative high voltage surge is applied, a p-n junction of diode 38 breaks down, and the surge is discharged to ground line 32. At the same time, diode 39 is biased forward, and the surge is discharged to ground line 33. An ordinary input signal applied to input terminal 30 is sent to internal circuit 31 via signal line 71 as it is.

Although the I/O protection circuit has a surge resistance, i.e., a resistance against a surge as described above, the surge resistance generally decreases in accordance with reduction in size of elements. There is also such a tendency that reduction in size promotes employment of SOI structures. Therefore, the semiconductor device having the SOI structure requires an I/O protection circuit having a higher resistance against surge.

SUMMARY OF THE INVENTION

Accordingly, a major object of the invention is to provide an I/O protection circuit having a high surge resistance.

According to an aspect of the invention, an I/O protection circuit formed on an insulating layer and connected between an I/O terminal and an internal circuit including a plurality of MOS transistors includes a first MOS element. The first MOS element includes a first semiconductor film formed on the insulating layer and connected between the I/O terminal and a first power supply line (including a ground line), a first gate insulating film formed on the first semiconductor film, and a first gate electrode formed on the first gate insulating film and being floated.

Since the first gate electrode of the first MOS element provided at the first power supply line side is floated, a high voltage surge does not destroy insulating properties of the first gate insulating film, resulting in improvement of the surge resistance.

According to another aspect of the invention, an I/O protection circuit formed on an insulating layer and connected between an I/O terminal and an internal circuit including a plurality of MOS transistors includes a first MOS element. The MOS transistors in the internal circuit are isolated from each other by a field shield method. The first MOS element includes a first semiconductor film formed on the insulating layer and connected between the I/O terminal and a first power supply line (including a ground line), a first gate insulating film formed on the first semiconductor film, and a first gate electrode formed on the first gate insulating film and at the same layer as a gate electrode provided for a field shield method.

Since the first gate electrode of the first MOS element is formed at the same layer as the gate electrode for the field shield method in the internal circuit, the first gate insulating film of the first MOS element is thicker than the gate insulating film of the MOS transistor in the internal circuit, resulting in improvement of a surge resistance.

According to still another aspect of the invention, an I/O protection circuit formed on an insulating layer and connected between an I/O terminal and an internal circuit includes a semiconductor film of a first conductivity type formed on the insulating layer, a plurality of first conductive regions of the first conductivity type formed at the semiconductor film and connected to the I/O terminal, and a plurality of second conductive regions of a second conductivity type formed at the semiconductor film and connected to a power supply line (including a ground line).

Since a plurality of diodes are formed at the semiconductor film, p-n junctions have a large area, so that a surge resistance is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Before describing the embodiments of the invention, examples of I/O protection circuits on which the invention is based will be described below with reference to FIGS. 19 to 22 for facilitating understanding of the invention. In the figures, the same reference numbers and characters denote the same or similar portions.

Figure 17:
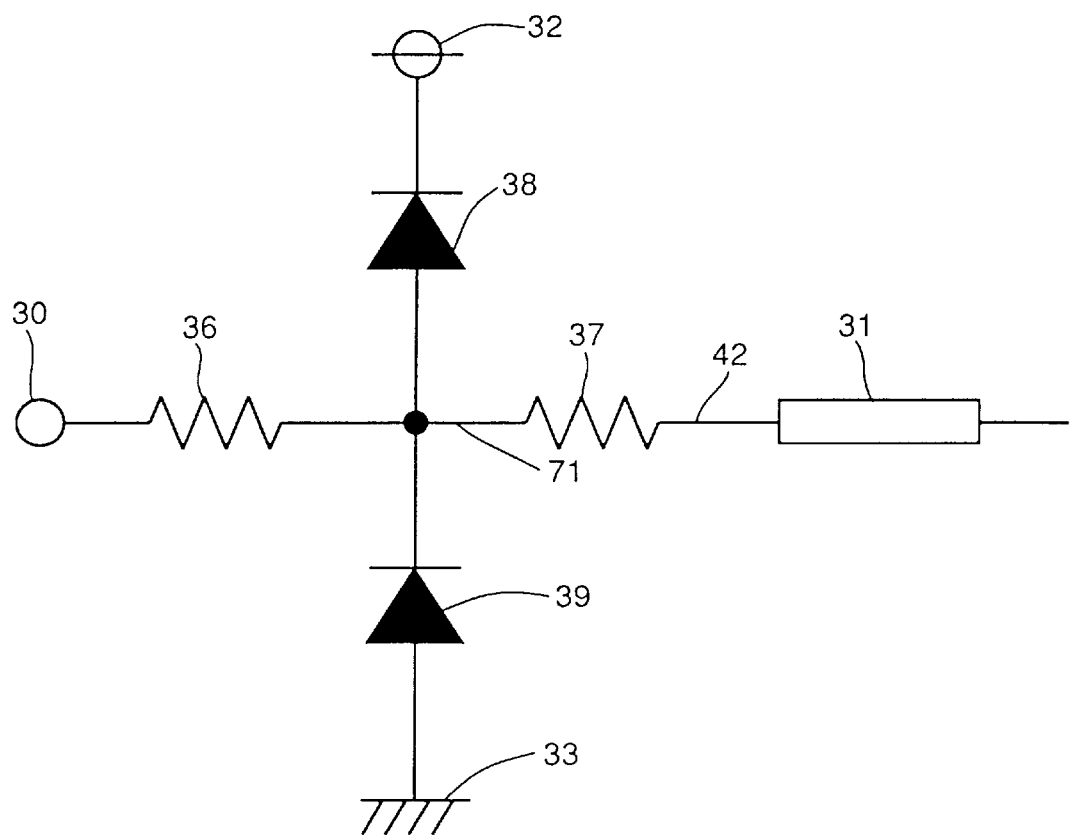
FIG. 17 is a circuit diagram showing a structure of a conventional input protection circuit.
Figure 19:
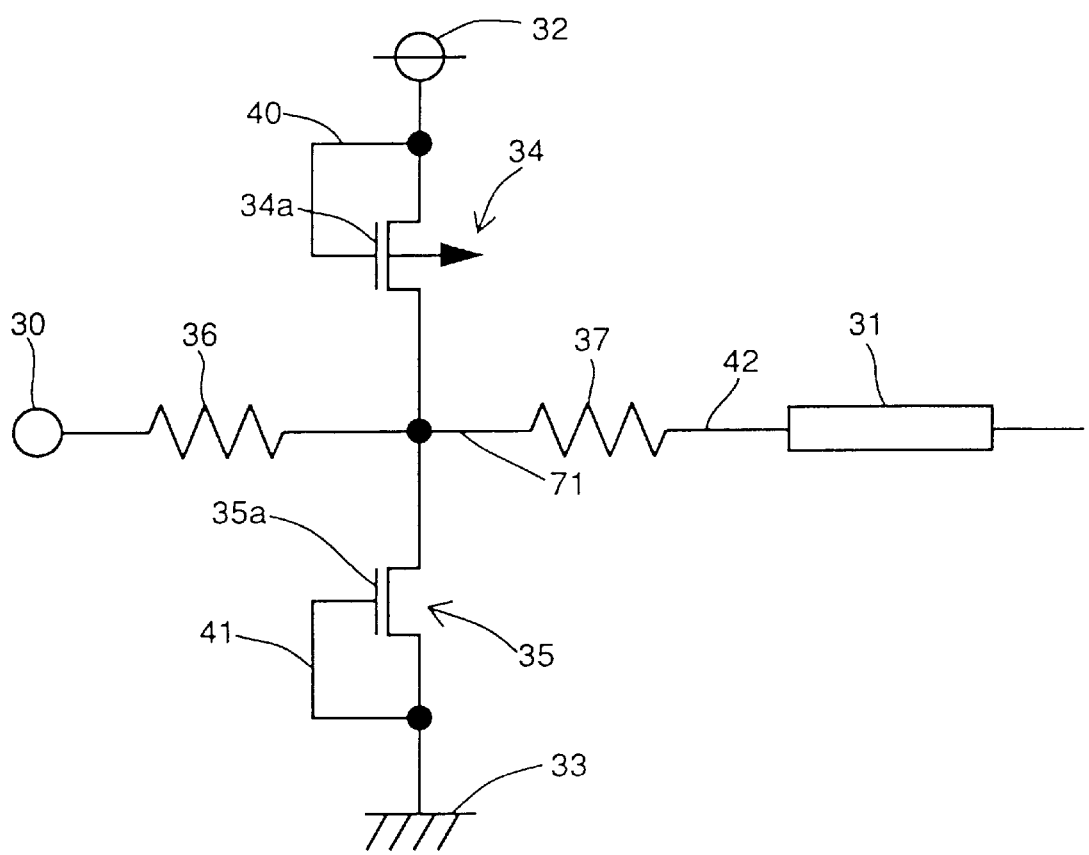
FIG. 19 is a circuit diagram showing a structure of an I/O protection circuit related to the invention.

An I/O protection circuit shown in FIG. 19 includes a P-channel MOS transistor 34 and an N-channel MOS transistor 35 instead of diodes 38 and 39 of the conventional I/O protection circuit shown in FIG. 17. A gate electrode 34a of P-channel MOS transistor 34 is connected to a power supply line 32, so that P-channel MOS transistor 34 is usually off. Since a gate electrode 35a of N-channel MOS transistor 35 is connected to ground line 33, N-channel MOS transistor 35 is also off.

In this I/O protection circuit, when a high voltage surge (e.g., positive high voltage surge) is applied, a p-n junction in N-channel MOS transistor 35 breaks down, so that the surge is rapidly discharged to ground line 33. At the same time, P-channel MOS transistor 34 is turned on, so that the surge is rapidly discharged to power supply line 32. Meanwhile, when a negative high voltage surge is applied, a p-n junction in P-channel MOS transistor 34 breaks down, so that the surge is rapidly discharged to power supply line 32. At the same time, N-channel MOS transistor 35 is on, and the surge is rapidly discharged to ground line 33.

Figure 20:
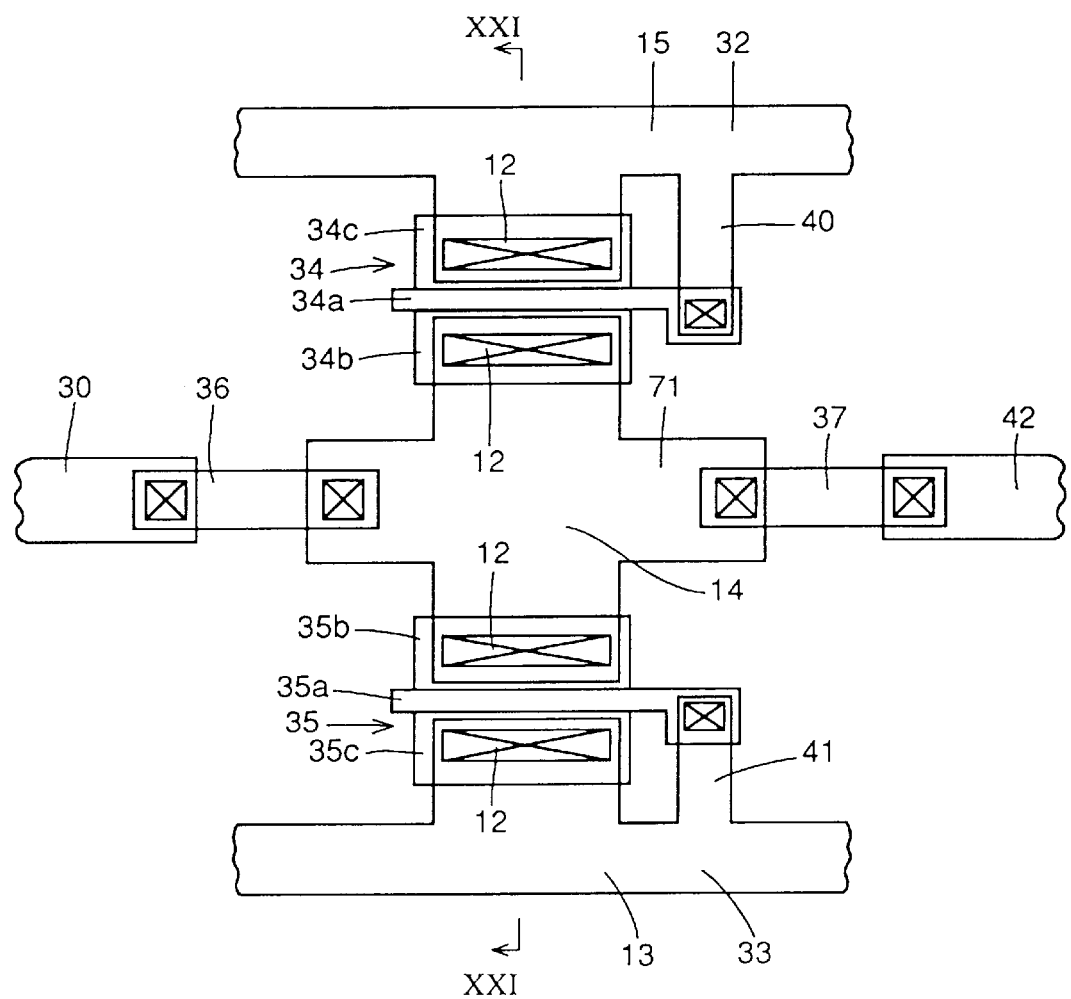
FIG. 20 is a plan showing a structure of the I/O protection circuit in FIG. 19.
Figure 21:
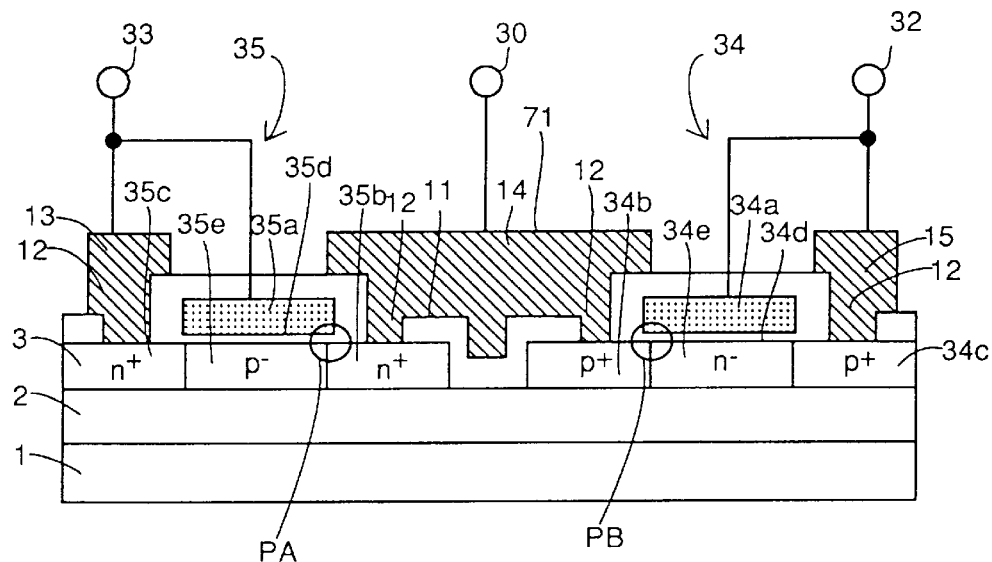
FIG. 21 is a cross section taken along line XXI—XXI in FIG. 20.

FIG. 20 is a plan showing a structure of the I/O protection circuit shown in FIG. 19. FIG. 21 is a cross section taken along line XXI—XXI in FIG. 20. Referring to FIGS. 20 and 21, a silicon thin film 3 is formed on a silicon substrate 1 with a buried oxide film 2, i.e., an insulating layer therebetween. Silicon thin film 3 is in an island-like form and is isolated from others. Silicon thin film 3 includes substrate regions 34e and 35e which are doped with impurity (of n-type for P-channel MOS transistor 34, and p-type for N-channel MOS transistor 35) at about $10^{17}/cm^3$, and also includes drain regions 34b and 35b and source regions 34c and 35c doped with impurity (of p-type for P-channel MOS transistor 34, and n-type for N-channel MOS transistor 35) at about $10^{20}/cm^3$. Drain regions 34b and 35b are spaced from source regions 34c and 35c with substrate regions 34e and 35e therebetween, respectively. Gate electrodes 34a and 35a are formed on silicon thin film 3 with gate insulating films 34d and 35d, respectively. An interlayer insulating film 11 is formed on these portions. Interlayer insulating film 11 is provided with contact holes 12 located above drain regions 34b and 35b and source regions 34c and 35c, respectively. Aluminum interconnections 13, 14 and 15 are formed on interlayer insulating film 11. Aluminum interconnection 15 forming power supply line 32 is connected to source region 34c of P-channel MOS transistor 34 through contact hole 12. Aluminum interconnection 14 forming a signal line 71 is connected to drain region 34b of P-channel MOS transistor 34 and drain region 35b of N-channel MOS transistor 35 through contact holes 12, respectively. Aluminum interconnection 13 forming ground line 33 is connected to source region 35c of N-channel MOS transistor 35 through contact hole 12.

A input resistance 36 is formed between input terminal 30 and signal line 71. An internal resistance 37 is formed between signal line 71 and an internal circuit connecting interconnection 42 for making a connection to internal circuit 31. Input resistance 36 and internal resistance 37 are formed at the same layer as the gate electrode or the silicon thin film. Gate electrode 34a of P-channel MOS transistor 34 is connected to power supply line 32 via a gate potential fixing interconnection 40, and gate electrode 35a of N-channel MOS transistor 35 is connected to ground line 33 via gate potential fixing interconnection 41. Therefore, P-channel MOS transistor 34 and N-channel MOS transistor 35 are off.

In the I/O protection circuit having the above structure, a p-n junctions formed by substrate region 35e and drain region 35b, in N-channel MOS transistor 35 breaks down when a positive high voltage surge is applied thereto. Since gate electrode 35a is connected to ground line 33, a high voltage is applied also to gate insulating film 35d, so that insulating properties of a portion indicated by PA in FIG. 21 may be destroyed. Meanwhile, when a negative high voltage surge is applied, a p-n junction in P-channel MOS transistor 34, which is formed of drain region 34b and substrate region 34e, breaks down. Since gate electrode 34a is connected to power supply line 32, a high voltage is applied also to gate insulating film 34d, so that insulating properties of a portion indicated by PB in FIG. 21 may be destroyed. This insulation destruction may reduce a surge resistance.

Figure 22:
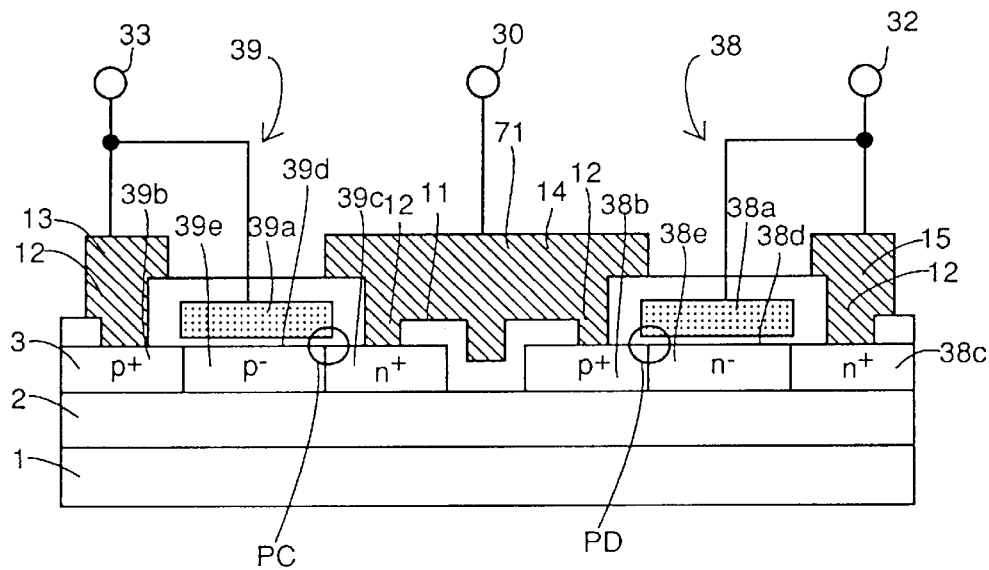
FIG. 22 is a cross section showing another structure of the I/O protection circuit related to the invention.

FIG. 22 is a cross section showing an example of a structure of the conventional I/O protection circuit shown in FIG. 17. This example uses gate diodes (gate control diodes) 38 and 39. Therefore, an n$^+$-type cathode region 38c which is doped with n-type impurity at about 10$^{20}$/cm$^3$ is formed instead of p$^+$-type source region 34c in FIG. 21. Further, a p$^+$-type anode region 39b doped with p-type impurity at 10$^{20}$/cm$^3$ is formed instead of n$^+$-type source region 35c in FIG. 21. Therefore, anode region 38b and cathode regions 38e and 38c form a diode. Also, cathode region 39c and anode regions 39b and 39e form a diode.

In the I/O protection circuit having the above structure, when a positive high voltage surge is applied, a p-n junction in gate diode 39, which is formed of anode region 39e and cathode region 39c, breaks down. Since gate electrode 39a is connected to ground line 33, a high voltage is also applied to a gate oxide film 39d, so that insulating properties of a portion indicated by PC in FIG. 22 may be destroyed. Meanwhile, when a negative high voltage surge is applied, a p-n junction in gate diode 38, which is formed of anode region 38b and cathode region 38e, breaks down. Since gate electrode 38a is connected to power supply line 32, a high voltage is also applied to a gate oxide film 38d, so that insulating properties of a portion indicated by PD in FIG. 22 may be destroyed. This destruction of insulating properties reduces a surge resistance, similarly to the I/O protection circuit using the above MOS transistors.

The embodiments of the invention, which will now be described below, are provided for overcoming the above problems, and their objects are to improve a surge resistance of the I/O protection circuit by preventing destruction of the gate insulating film which may be caused by application of the high voltage surge.

[Embodiment 1]

Figure 1:
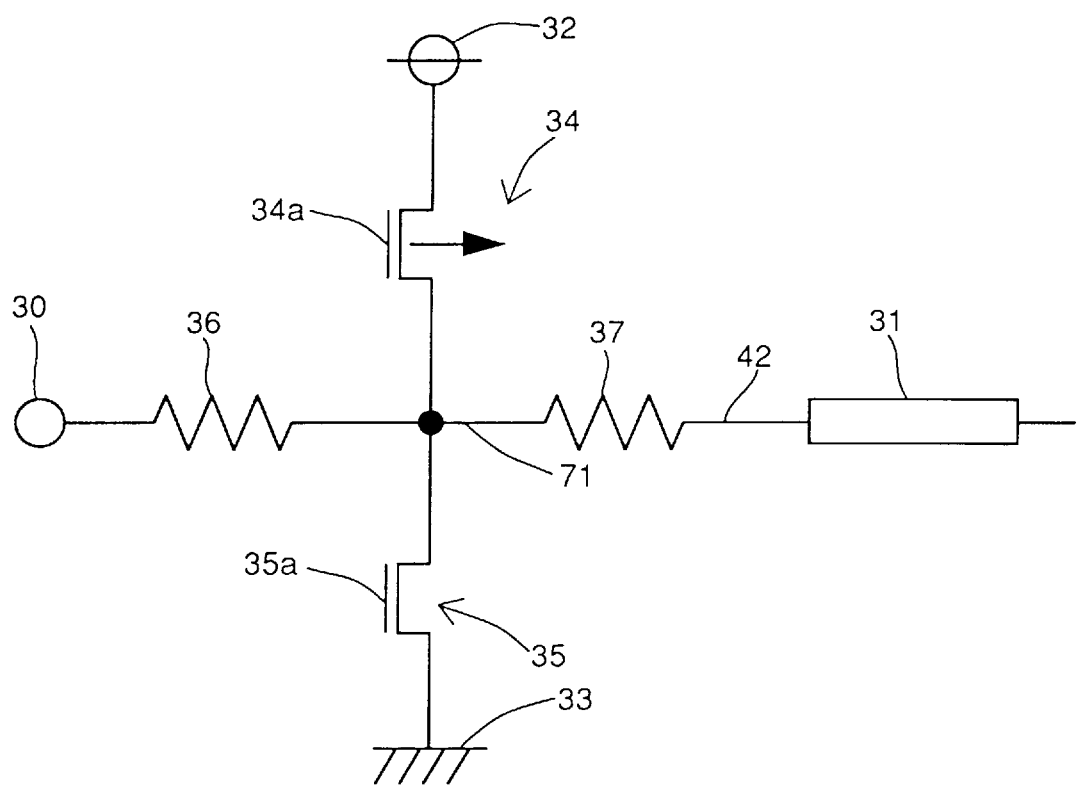
FIG. 1 is a circuit diagram showing a structure of an I/O protection circuit of an embodiment 1 of the invention.
Figure 18:
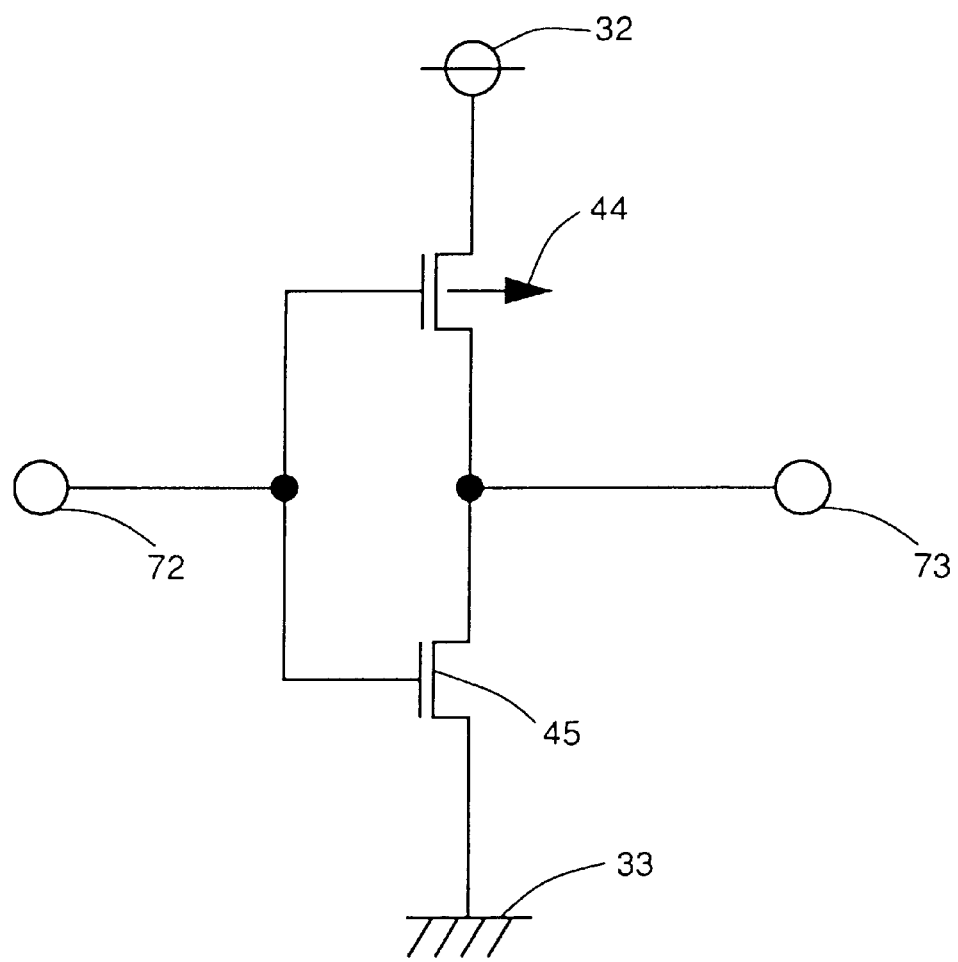
FIG. 18 is a circuit diagram showing an example of an internal circuit protected by the input protection circuit in FIG. 17.

FIG. 1 is a circuit diagram showing a structure of an I/O protection circuit of an embodiment 1 of the invention. Referring to FIG. 1, the I/O protection circuit includes a input resistance 36, an internal resistance 37, a P-channel MOS transistor 34 and an N-channel MOS transistor 35. An input terminal 30 is connected to internal circuit 31 via input resistance 36 and internal resistance 37. P-channel MOS transistor 34 has a source connected to a power supply line 32, a drain connected to a signal line 71 and a floated gate electrode 34a. N-channel MOS transistor 35 has a source connected to a ground line 33, a drain connected to a signal line 71 and a floated gate electrode 35a. Internal circuit 31 is formed of, e.g., a CMOS inverter shown in FIG. 18. The I/O protection circuit of the embodiment 1 differs from the I/O protection circuit shown in FIG. 19 in that gate electrodes 34a and 35a of MOS transistors 34 and 35 are floated.

Figure 2:
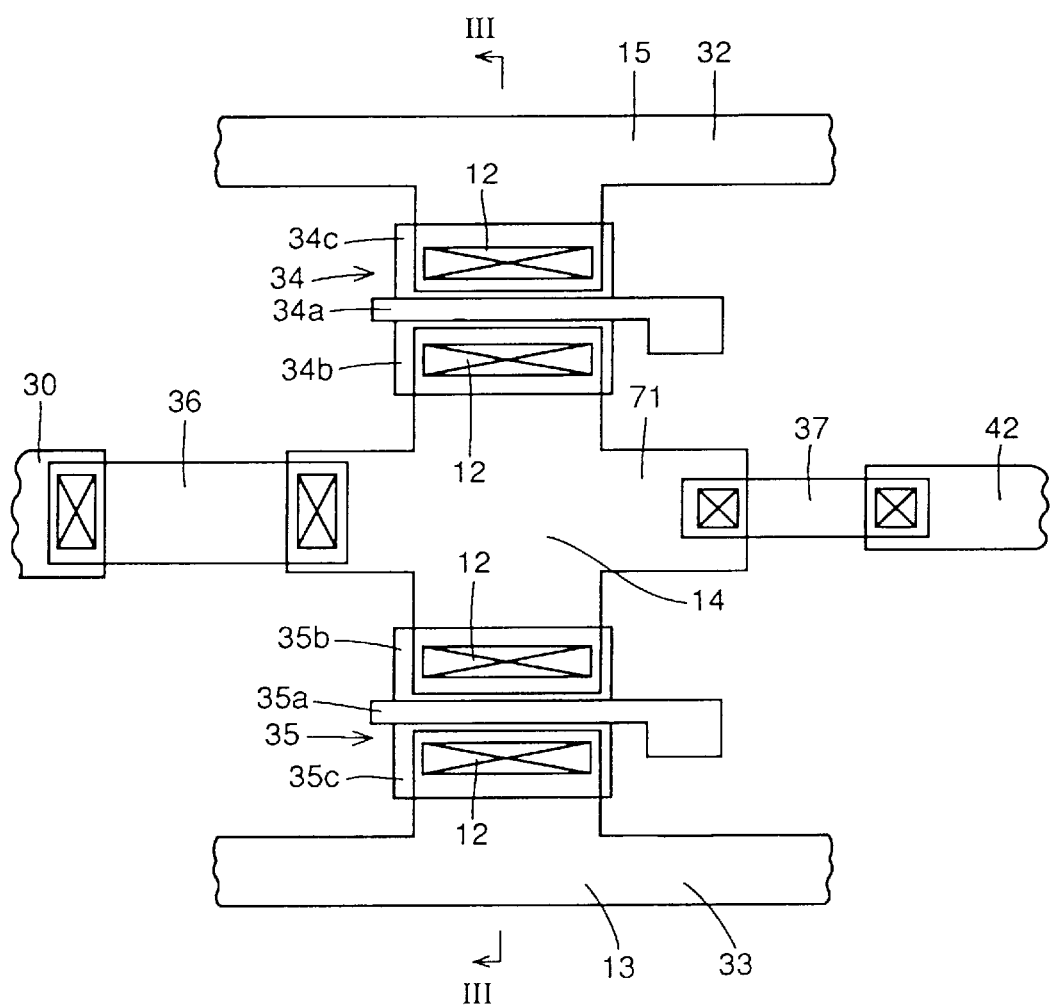
FIG. 2 is a plan showing a structure of the I/O protection circuit in FIG. 1.
Figure 3:
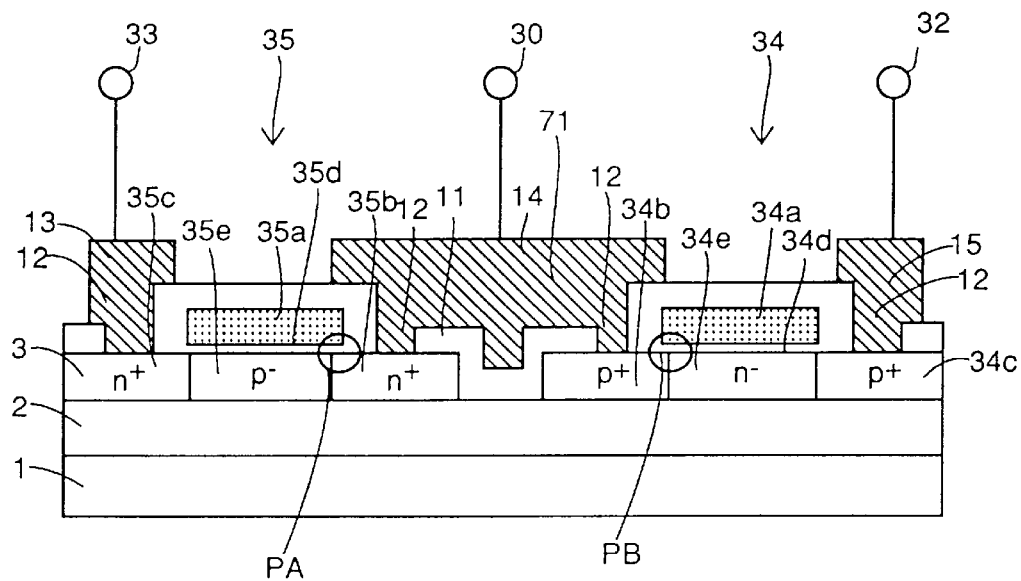
FIG. 3 is a cross section taken along line III—III in FIG. 2.

FIG. 2 is a plan showing a structure of the I/O protection circuit shown in FIG. 1. FIG. 3 is a cross section taken along line III—III in FIG. 2. Referring to FIGS. 2 and 3, the I/O protection circuit is formed on a buried oxide film 2, i.e., an insulating layer. An internal circuit (not shown) is also formed on buried oxide film 2. Buried oxide film 2 is formed on silicon substrate 1. A silicon thin film 3 is formed on buried oxide film 2 and is in an island-like form isolated from others. Gate insulating films 34d and 35d are formed on silicon thin film 3, and gate electrodes 34a and 35a are formed on gate insulating films 34d and 35d, respectively. Silicon thin film 3 for P-channel MOS transistor 34 is formed of an n$^-$-type substrate region 34e, a p$^+$-type source region 34c and a p$^+$-type drain region 34b. More specifically, substrate region 34e is doped with n-type impurity at about 10$^{17}$/cm$^3$. Source regions 34c and drain region 34b are doped with p-type impurity at about 10$^{20}$/cm$^3$. Substrate region 34e is located under gate electrode 34a. Source region 34c neighbors to one side of substrate region 34e. Drain region 34b neighbors to the other side of substrate region 34e.

Silicon thin film 3 for the N-channel MOS transistor is formed of a p$^-$-type substrate region 35e, an n$^+$-type source region 35c and an n$^+$-type drain region 35b. More specifically, substrate region 35e is doped with p-type impurity at about 10$^{17}$/cm$^3$. Source region 35c is doped with n-type impurity at about 10$^{20}$/cm$^3$. Drain region 35b is doped with n-type impurity at about 10$^{20}$/cm$^3$. Substrate region 35e is located under gate electrode 35a. Source region 35c neighbors to one side of substrate region 35e. Drain region 35b neighbors to the other side of substrate region 35e.

In a manufacturing process, the p-type impurity is simultaneously introduced into source region 34c and drain region 34b masked with gate electrode 34a. n-type impurity is simultaneously introduced into source region 35c and drain region 35b masked with gate electrode 35a.

An interlayer insulating film 11 is formed on gate electrodes 34a and 35a and silicon thin film 3. Interlayer insulating film 11 is provided with contact holes 12 reaching source regions 34c and 35c, and drain regions 34b and 35b, respectively. Aluminum interconnections 13, 14 and 15 are formed on interlayer insulating film 11. Therefore, aluminum interconnection 15 forming power supply line 32 is in contact with source region 34c of P-channel MOS transistor 34 through contact hole 12. Aluminum interconnection 14 forming signal line 71 is in contact with drain region 34b of P-channel MOS transistor 34 and drain region 35b of N-channel MOS transistor 35 through contact holes 12, respectively. Aluminum interconnection 13 forming ground line 33 is in contact with source region 35c of N-channel MOS transistor 35. As a result, source region 34c of P-channel MOS transistor 34 is connected to power supply line 32, and drain region 34b thereof is connected to input terminal 30. Source region 35c of N-channel MOS transistor 35 is connected to ground line 33, and drain region 35b thereof is connected to input terminal 30.

Input resistance 36 is formed between input terminal 30 and signal line 14. Internal resistance 37 is formed between signal line 71 and an internal circuit connecting interconnection 42. Input resistance 36 and internal resistance 37 are formed from the same layer as the silicon thin film or gate electrodes 34a and 35a. Input resistance 36 is wider than internal resistance 37. Therefore, a current density of input resistance 36 is reduced, so that input resistance 36 is prevented from being destroyed by a large current flowing into MOS transistors 34 and 35. The gate electrode 34a of P-channel MOS transistor 34 is not connected to other interconnections such as power supply line 32. The gate electrode 35a of N-channel MOS transistor 35 is not connected to other interconnections such as ground line 33. Therefore, both gate electrodes 34a and 35a are floated.

As described above, the embodiment 1 differs from the structure shown in FIGS. 20 and 21 in that gate electrodes 34a and 35a are floated.

In general, gate electrodes 34a and 35a are likely to be influenced by a capacity coupling if they are floated. Therefore, the gate potential slightly shifts toward the drain potential side in accordance with change in the drain potential. When the input signal is applied from input terminal 30 to internal circuit 31 via signal line 71, both MOS transistors 34 and 35 are slightly turned on, so that a DC current may disadvantageously flow from power supply line 32 to ground line 33. In order to reduce this DC current and therefore a power consumption, it is preferable that the impurity concentrations of substrate regions 34e and 35e are higher that the impurity concentration of the substrate regions of MOS transistors (e.g., transistors 44 and 45 in FIG. 18) in the internal circuit. For example, if the impurity concentration of the substrate region of the MOS transistor in the internal circuit is about $1 \times 10^{17}/cm^3$, it is preferable that the impurity concentration of substrate regions 34e and 35e is larger than $10^{18}/cm^3$, i.e., double the above value.

In order to set the threshold voltages of MOS transistors 34 and 35 to high values, it is necessary to avoid application of an effective gate voltage due to difference in work function between gate electrode materials. For example, if a gate electrode in an N-channel MOS transistor in the internal circuit is made of a material containing n-type polycrystalline silicon, it is preferable that gate electrode 35a of N-channel MOS transistor 35 in the I/O protection circuit is made of p-type polycrystalline silicon. Meanwhile, if a gate electrode of a P-channel MOS transistor in the internal circuit is made of a material containing p-type polycrystalline silicon, it is preferable that gate electrode 34a of P-channel MOS transistor 34 in the I/O protection circuit is made of n-type polycrystalline silicon. Thus, such a structure is preferable that, in the I/O protection circuit, gate electrodes 34a and 35a are made of polycrystalline silicon of the same conductivity type as substrate regions 34e and 35e, and, in internal circuits other than the I/O protection circuit, the gate electrodes are made of polycrystalline silicon of the conductivity type opposite to that of the substrate region. Thereby, the threshold voltage of each of MOS transistors 34 and 35 in the I/O protection circuit increases about 1V, so that it is possible to prevent flow of a DC current from power supply line 32 to ground line 33.

An operation of the I/O protection circuit thus constructed will be described below. A surge applied through I/O terminal 30 is applied through input resistance 36 to signal line 71. Therefore, a positive high voltage surge breaks down a p-n junction formed of substrate region 35e and drain region 35b of N-channel MOS transistor 35, whereby the surge is discharged by N-channel MOS transistor 35 to ground line 33. At this time, gate electrode 35a is not connected to ground line 33 but is floated, so that a high voltage is not applied to gate insulating film 35d, and insulating properties of the portion indicated by PA in FIG. 3 are not destroyed. Meanwhile, a negative high voltage surge breaks down a p-n junction formed of drain region 34b and substrate region 34e of P-channel MOS transistor 34, so that the surge is discharged by P-channel MOS transistor 34 to power supply line 32. At this time, gate electrode 34a is not connected to power supply line 32 but is floated. Therefore, a high voltage is not applied to gate insulating film 34d, so that insulating properties of the portion indicated by PB in FIG. 3 are not destroyed. Consequently, a surge resistance of this I/O protection circuit is significantly improved.

Although substrate regions 34e and 35e may be electrically fixed, it is desirable that they are electrically floated for promoting drain break-down.

[Embodiment 2]

Figure 4:
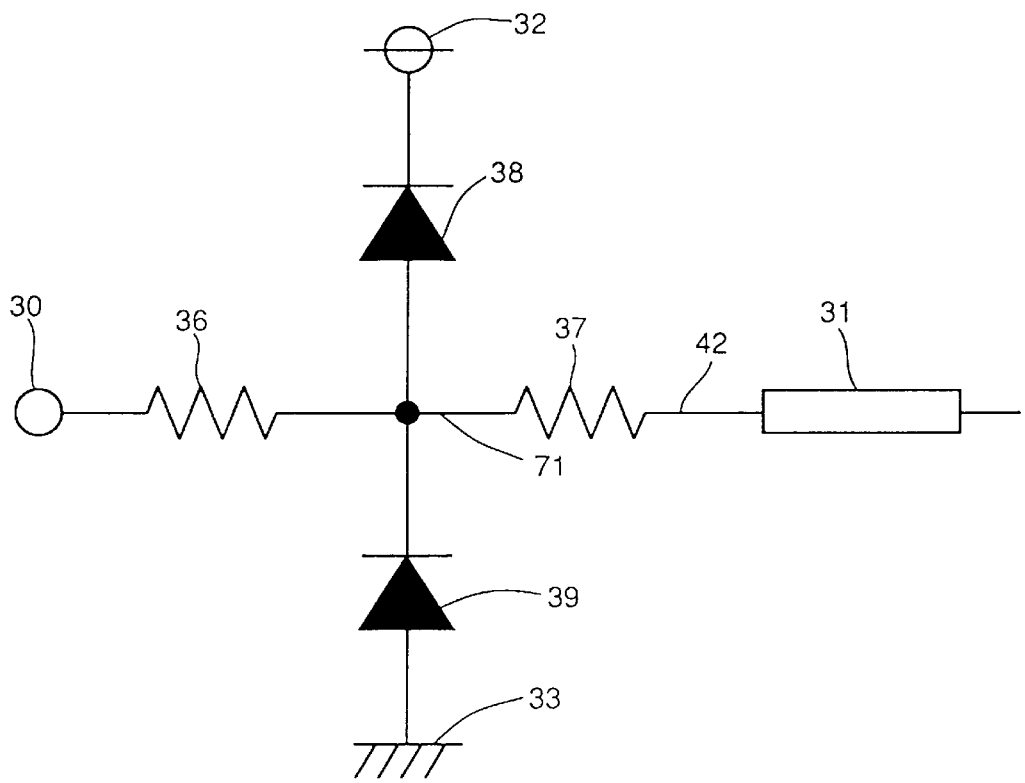
FIG. 4 is a circuit diagram showing a structure of an I/O protection circuit of an embodiment 2 of the invention.

FIG. 4 is a circuit diagram showing a structure of an I/O protection circuit of an embodiment 2 of the invention. Referring to FIG. 4, the I/O protection circuit is provided with diodes 38 and 39 instead of MOS transistors 34 and 35 in FIG. 1. A circuit structure shown in FIG. 4 is the same as the conventional structure shown in FIG. 17.

Figure 5:
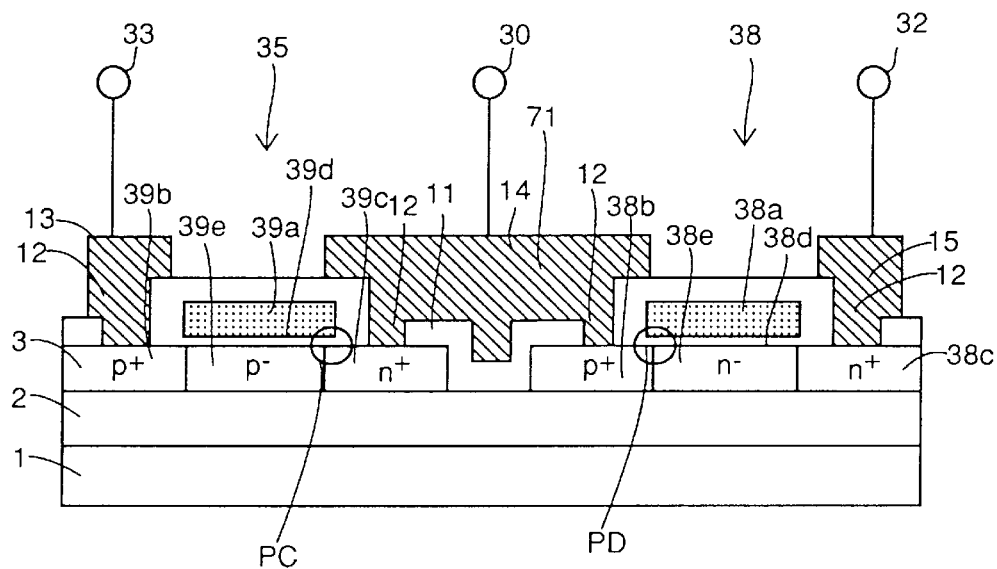
FIG. 5 is a cross section showing a structure of the I/O protection circuit in FIG. 4.

FIG. 5 is a cross section showing a structure of the I/O protection circuit shown in FIG. 4. As shown in FIG. 5, this I/O protection circuit includes an $n^+$-type cathode region 38c and a $p^+$-anode region 39b instead of source regions 34c and 35c in FIG. 3, respectively. Silicon thin film 3 for diode 38 is formed of an $n^-$-type cathode region 38e, an $n^+$-type cathode region 38c and a $p^+$-type anode region 38b. Cathode region 38e is located under a gate electrode 38a. Cathode region 38c neighbors to one side of cathode region 38e, and is connected to power supply line 32. Anode region 38b neighbors to the other side of cathode region 38e, and is connected to input terminal 30. Silicon thin film 3 for diode 39 is formed of a $p^-$-type anode region 39e, a $p^+$-type anode region 39b and an $n^+$-type cathode region 39c. Anode region 39e is located under a gate electrode 39a. Anode region 39b neighbors to one side of anode region 39e, and is connected to ground line 33. Cathode region 39c neighbors to the other side of anode region 39e, and is connected to I/O terminal 30. Gate electrode 38a is not connected to any interconnection, and is electrically floated. Gate electrode 39a is not connected to any interconnection, and is electrically floated.

Therefore, the I/O protection circuit of the embodiment 2 differs from the structure shown in FIG. 22 in that gate electrodes 38a and 39a are floated.

In the I/O protection circuit having the above structure, a positive high voltage surge breaks down a p-n junction formed of anode region 39e and cathode region 39c of diode 39, so that the surge is discharged by diode 39 to ground line 33. However, gate electrode 39a is not connected to the other interconnections such as ground line 33, and is floated, so that insulating properties of the portion indicated by PC in FIG. 5 are not destroyed. Meanwhile, a negative high voltage surge breaks down a p-n junction formed of anode region 38b and cathode region 38e of diode 38, so that the surge is discharged by diode 38 to power supply line 32. However, gate electrode 38a is not connected to other interconnections such as power supply line 32, and is floated, so that insulating properties of a portion indicated by PD in FIG. 5 are not destroyed. As a result, the I/O protection circuit has an improved surge resistance.

Similarly to the embodiment 1, it is preferable that the I/O protection circuit of the embodiment 2 has cathode region 38e and anode region 39e of which impurity concentrations are higher that those of substrate regions of MOS transistors in an internal circuit other than the I/O protection circuit. If gate electrodes of N-channel MOS transistors in the internal circuit are made of n-type polycrystalline silicon, it is preferable that gate electrode 39a of diode 39 in the I/O protection circuit is made of p-type polycrystalline silicon. If gate electrodes of P-channel MOS transistors in the internal circuit are made of p-type polycrystalline silicon, it is preferable that gate electrode 38a of diode 38 in the I/O protection circuit is made of n-type polycrystalline silicon. Although cathode region 38e and anode region 39e may be electrically fixed, it is preferable that they are electrically floated for promoting drain break-down.

[Embodiment 3]

Figure 6:
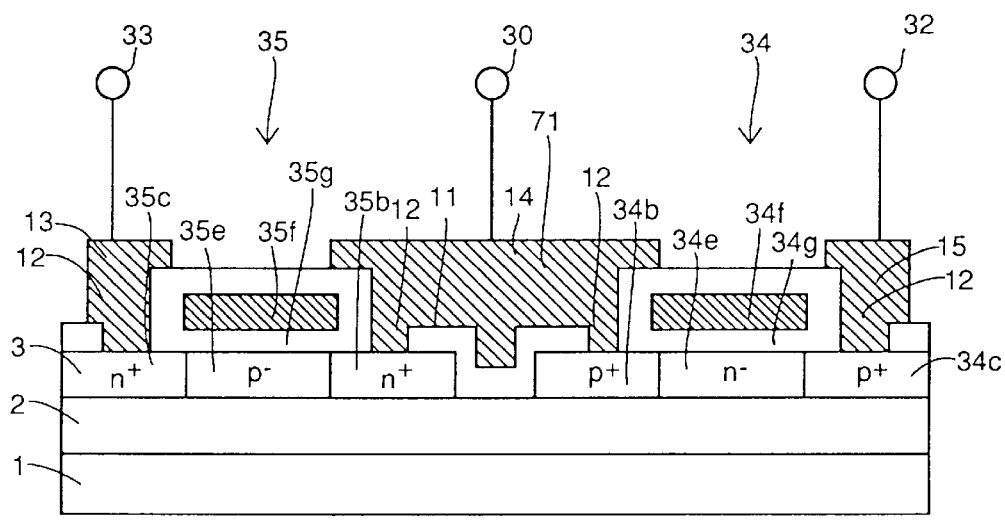
FIG. 6 shows a structure of an I/O protection circuit of an embodiment 3 of the invention.
Figure 7:
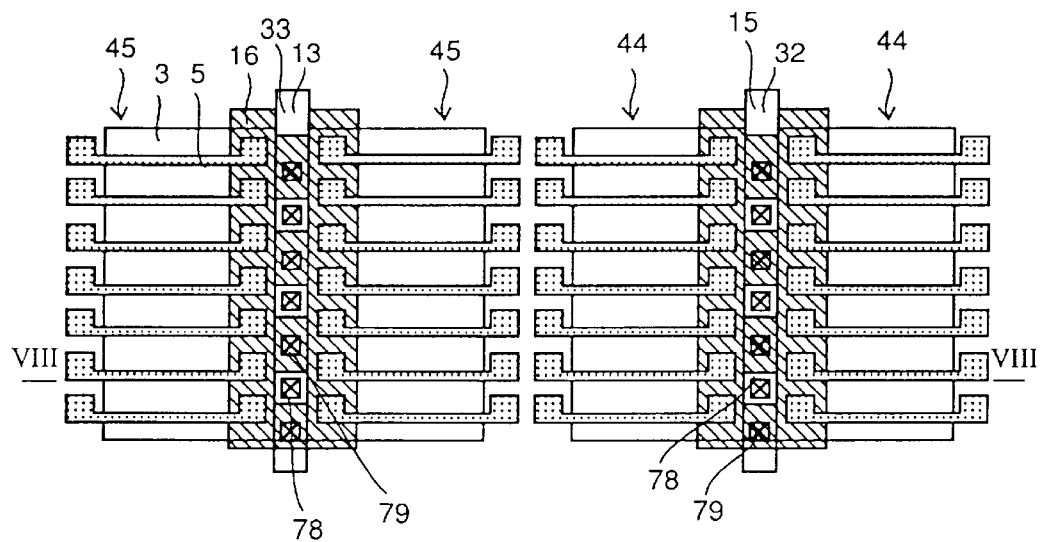
FIG. 7 is a plan showing a structure of a gate array protected by the I/O protection circuit in FIG. 6.
Figure 8:
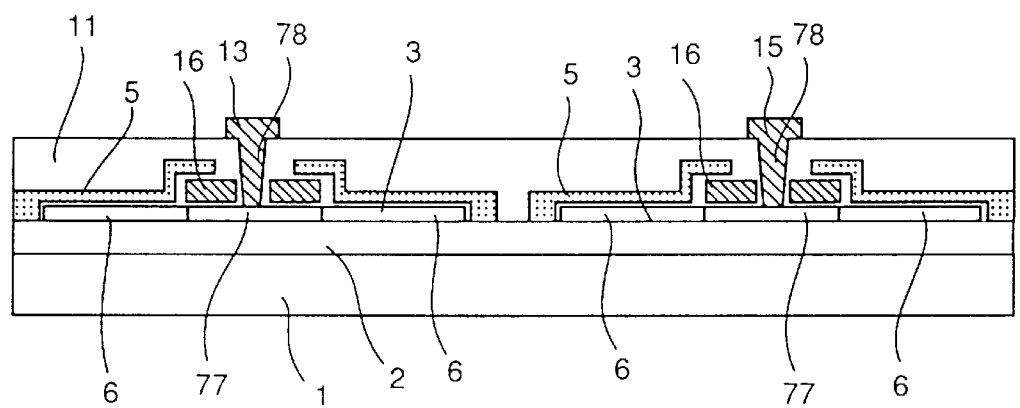
FIG. 8 is a cross section taken along line VIII—VIII in FIG. 7.

FIG. 6 is a cross section showing a structure of an I/O protection circuit of an embodiment 3 of the invention. FIG. 7 is a plan showing a structure of a gate array (internal circuit) protected against a surge by the I/O protection circuit shown in FIG. 6. FIG. 8 is a cross section taken along line VIII—VIII in FIG. 7.

Generally, a substrate region of an MOS transistor having an SOI structure is electrically floated. In the gate array shown in FIGS. 7 and 8, however, a substrate region 6 of a P-channel MOS transistor 44 is fixed to the power supply potential, and substrate region 6 of an N-channel MOS transistor 45 is fixed to the ground potential.

As shown in FIGS. 7 and 8, silicon thin film 3 for P-channel MOS transistor 44 and silicon thin film 3 for N-channel MOS transistor 45 are formed on buried oxide film 2. Substrate region 6 of P-channel MOS transistor 44 at an upper left portion in the figure is connected to substrate region 6 of P-channel MOS transistor 44 in an upper right portion in the figure via a body region 77. Substrate region 6 of N-channel MOS transistor 45 at an upper left portion in the figure is connected to substrate region 6 of N-channel MOS transistor 45 at an upper right portion in the figure via body region 77. A gate electrode 16 for field shield isolation is formed on each body region 77 with a thick gate insulating film therebetween. A gate electrode 5 is formed on each substrate region 6 with a thin gate insulating film which is thinner than the gate insulating film for field shied.

The gate electrode 16 for field shield is provided with openings spaced from each other by a predetermined distance. Body region 77 near P-channel MOS transistor 44 is connected to power supply line 32 formed of aluminum interconnection 15 through a contact hole 78 formed in its opening. Body region 77 near N-channel MOS transistor 45 is connected to ground line 33 formed of aluminum interconnection 13 through contact hole 78 formed in its opening. Gate electrode 16 near P-channel MOS transistor 44 is connected to power supply line 32 through a contact hole 79. Gate electrode 16 of N-channel MOS transistor 45 is connected to ground line 33 through contact hole 79.

Therefore, each gate electrode 16 isolates MOS transistors 44 or 45 at opposite sides thereof from each other by the field shield manner. Substrate region 6 of P-channel MOS transistor 44 is connected to power supply line 32 via body region 77, so that it is fixed to the power supply potential. Substrate region 6 of N-channel MOS transistor 45 is connected to ground line 33 via body region 77, so that it is fixed to the ground potential. Other structures of the gate array using the field shied isolation have been specifically disclosed in Japanese Patent Laying-Open No. 7-94754 (1975), and therefore will not be described below.

In the gate array thus constructed, substrate regions 6 of MOS transistors 44 and 45 are electrically fixed, so that its operation characteristics are stable.

In the I/O protection circuit for protecting the above gate array, gate insulating films 34g and 35g at the same level as the gate insulating film for field shield isolation are formed on substrate regions 34e and 35e, as shown in FIG. 6. Further, gate electrodes 34f and 35f at the same level as gate electrode 16 for field shield isolation are formed on gate insulating films 34g and 35g, respectively. Both gate electrodes 34f and 35f are floated. Therefore, the I/O protection circuit of this embodiment 3 differs from the structure shown in FIG. 5 in that gate insulating films 34g and 35g are thicker than gate insulating films 38d and 39d in FIG. 5, respectively.

For example, in a gate array designed in accordance with 0.35 $\mu$m rule, an MOS transistor has a very thin gate insulating film of about 70 Å in thickness. Therefore, if the MOS transistor in the I/O protection circuit were provided with a gate insulating film formed of the same layer as the gate insulating film of the MOS transistor in the gate array, a breakdown voltage of the gate insulating film in the I/O protection circuit would be low. Meanwhile, the gate insulating film for field shield isolation has a large thickness of about 500 Å. Therefore, if gate insulating films 34g and 35g of MOS transistors 34 and 35 in the I/O protection circuit were formed from the same layer as the gate insulating film for field shield isolation, gate insulating films 34g and 35g would have an increase breakdown voltage. In general, the insulating breakdown voltage is proportional to the thickness, so that the insulating breakdown voltage can be increased by seven times in the above case. Consequently, this I/O protection circuit can have an improved surge resistance.

In FIG. 6, gate electrodes 34f and 35f are floated. Alternatively, gate electrodes 34f and 35f may be connected to power supply line 32 and ground line 33, respectively, as is done in the structure shown in FIG. 21. In this case, as shown in FIG. 6, the surge resistance is reduced as compared with the case where gate electrodes 34f and 35f are floated as shown in FIG. 6, but is improved as compared with the structure shown in FIG. 21.

Although MOS transistors 34 and 35 are used for discharging the surge, gate diodes may be used instead of them similarly to the embodiment 2. Thus, the gate electrodes of the gates diodes may be formed from the same layer as the gate electrode for field shield isolation.

Generally, silicon thin film 3 has a low resistance value, and the gate electrode of MOS transistor is silicided for reducing its resistance value in many cases. Therefore, if input resistance 36 and internal resistance 37 are formed of gate electrodes (of which typical sheet resistance is 2$\Omega$) having a layered structure made of polycrystalline silicon and titanium silicide, it would be difficult to set their resistance values to appropriate values. Conversely, it is generally easy to set resistance values of input resistance 36 and internal resistance 37 to appropriate values, if they are formed of gate electrodes (of which typical sheet resistance is 20$\Omega$) for field shield isolation having a single layer structure of polycrystalline silicon.

[Embodiment 4]

Figure 9:
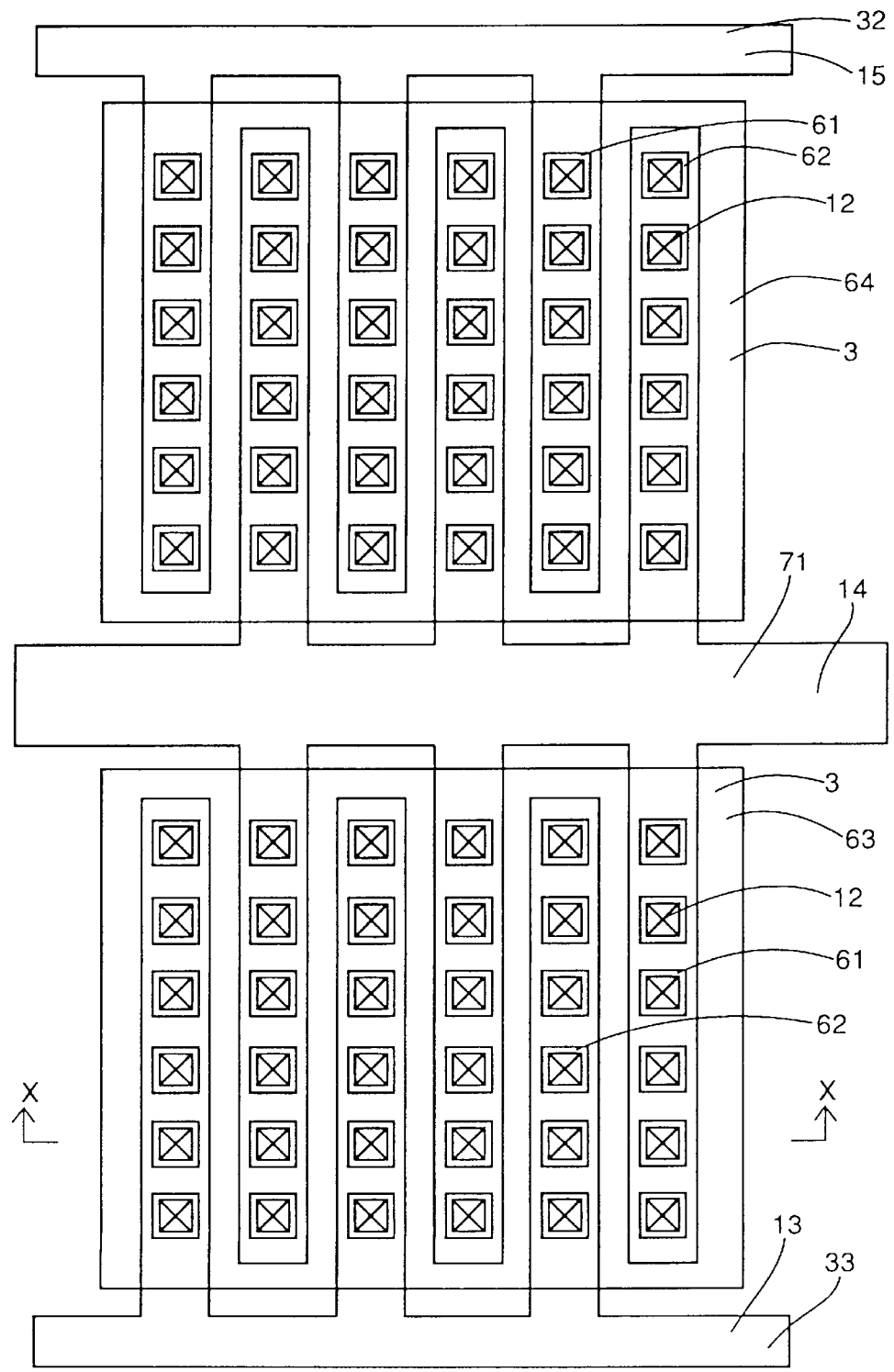
FIG. 9 is a plan showing a structure of an I/O protection circuit of an embodiment 4 of the invention.
Figure 10:
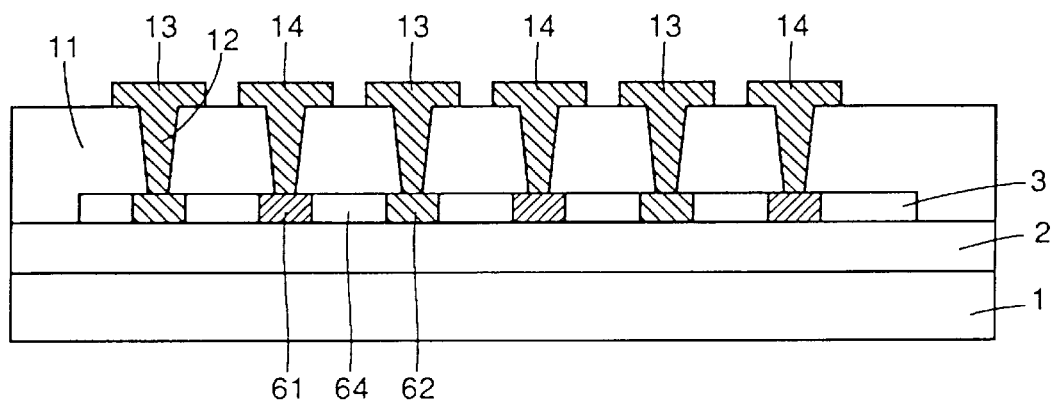
FIG. 10 is a cross section taken along line X—X in FIG. 9.

FIG. 9 is a plan showing a structure of an I/O protection circuit of an embodiment 4 of the invention. FIG. 10 is a cross section taken along line X—X in FIG. 9. This embodiment 4 aimed at increasing of a p-n junction area of diodes in the I/O protection circuit.

As shown in FIG. 9, silicon thin film 3 near power supply line 32 includes a p$^-$-type region 64 doped with p-type impurity at about $1 \times 10^{17}/cm^3$, a plurality of n$^+$-type regions 61 doped with n-type impurity at about $1 \times 10^{20}/cm^3$, and a plurality of p$^+$-type regions 62 doped with p-type impurity at about $1 \times 10^{20}/cm^3$. n$^+$-type regions 61 and p$^+$-type regions 62 are arranged in a matrix form. n$^+$-type regions 61 are disposed along a straight line in each of odd-numbered columns in the matrix. p$^+$-type regions 62 are disposed along a straight line in each of even-numbered columns in the matrix. In each row, therefore, n$^+$-type regions 61 and p$^+$-type regions 62 are disposed alternately to each other. All n$^+$-type regions 61 are commonly connected to power supply line 32 through contact holes 12 formed above the same, respectively. All p$^+$-type regions 62 are connected commonly to signal line 71 through contact holes 12 formed above the same, respectively.

Silicon thin film 3 near power supply line 33 includes an n$^-$-type region 63 doped with n-type impurity at about $1 \times 10^{17}/cm^3$, a plurality of n$^+$-type regions 61 doped with n-type impurity at about $1 \times 10^{20}/cm^3$, and a plurality of p$^+$-type regions 62 doped with p-type impurity at about $1\times10^{20}/cm^3$. n$^+$type regions 61 and p$^+$-type regions 62 are arranged in a matrix form. n$^+$-type regions 61 are disposed along a straight line in each of even-numbered columns in the matrix. p$^+$-type regions 62 are disposed along a straight line in each of odd-numbered columns in the matrix. In each row, therefore, n$^+$-type regions 61 and p$^+$-type regions 62 are disposed alternately to each other. All n$^+$-type regions 61 are commonly connected to signal line 71 through contact holes 12 formed above the same, respectively. All p$^+$-type regions 62 are connected commonly to ground line 33 through contact holes 12 formed above the same, respectively.

The equivalent circuit of the I/O protection circuit having the above structure is similar to that shown in FIG. 4. Thus, p$^-$-type region 64 and a plurality of n$^+$-type regions 61 form diode 38 in FIG. 4, and a plurality of p$^+$-type regions 62 and n$^-$-type region 63 form diode 39 in FIG. 4.

Since this I/O protection circuit includes p$^-$-type region 64 which is formed at silicon thin film 3 near power supply line 32, p$^-$-type region 64 functions as an effective resistance connected between diode 38 and signal line 71. Since n$^-$-type region 63 is formed at silicon thin film 3 near ground line 33, n$^-$-type region 63 functions as an effective resistance connected between signal line 71 and diode 39. Therefore, it is possible to prevent rapid application of a surge to p-n junctions of diodes 38 and 39.

According to the embodiment 4, the diode for surge discharging is not provided with a gate electrode. Therefore, the gate insulating film is not destroyed by a high voltage, so that reduction in surge resistance is prevented.

[Embodiment 5]

Figure 11:
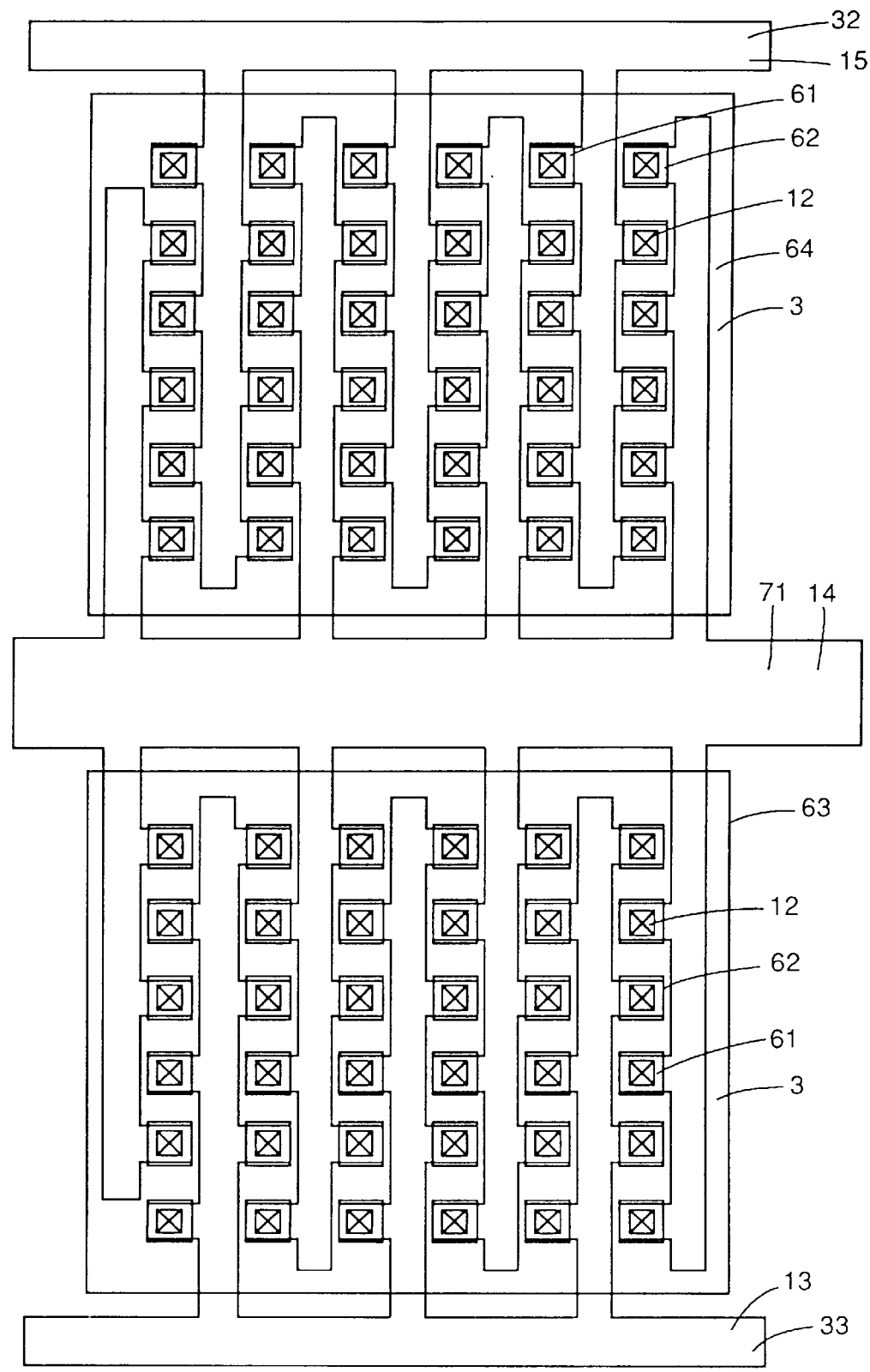
FIGS. 11, 12 and 13 are plans showing structures of I/O protection circuits of embodiments 5, 6 and 7 of the invention, respectively.

FIG. 11 is a plan showing a structure of an I/O protection circuit of an embodiment 5 of the invention. This I/O protection circuit differs from the structure shown in FIG. 9 in that n$^+$-type regions 61 and p$^+$-type regions 62 are disposed alternately to each other. More specifically, n$^+$-type regions 61 and p$^+$-type regions 62 are disposed alternately to each other in each of rows and columns.

In the embodiment 5, n$^+$-type regions 61 and p$^+$-type regions 62 are disposed alternately, so that current paths are dispersed, which reduces a current density. This improves a surge resistance.

[Embodiment 6]

Figure 12:
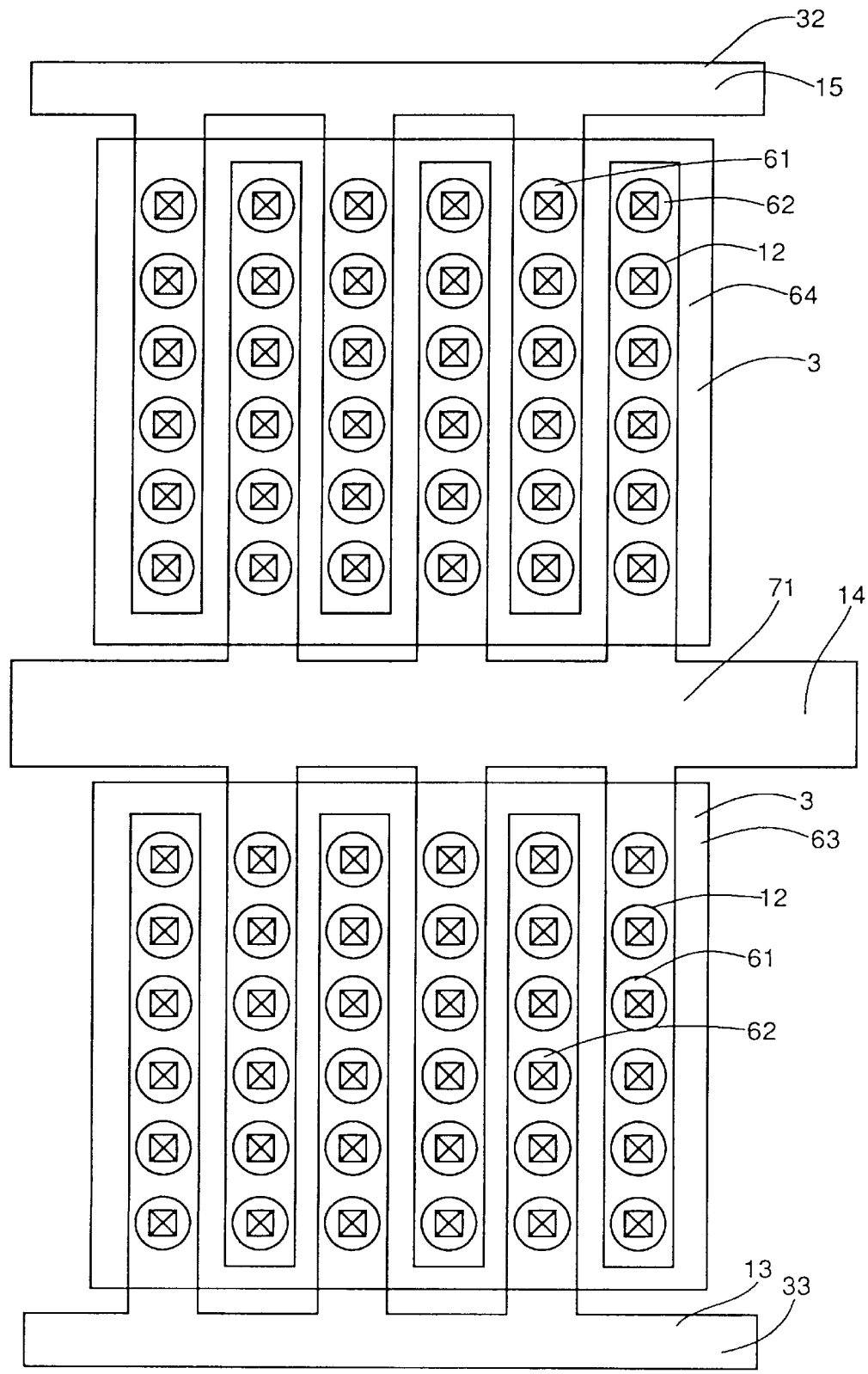

FIG. 12 is a plan showing a structure of an I/O protection circuit of an embodiment 6 of the invention. This I/O protection circuit differs from the structure shown in FIG. 9 in that each of n$^+$-type regions 61 and p$^+$-type regions 62 has a circular form. In regions 61 and 62 which are square as shown in FIG. 9, an electric field is concentrated at corners, which may reduce a surge resistance. In contrast to this, local concentration of the electric field does not occur at circular regions 61 and 62 shown in FIG. 12. Consequently, a surge resistance is improved. It is not essential that regions 61 and 62 are circular in order to achieve the above effect. In summary, it is necessary to form round interfaces between regions 63 and 64 and regions 61 and 62. Therefore, the above effect can be achieved by rounding the corners of square regions 61 and 62 shown in FIG. 9.

[Embodiment 7]

Figure 13:
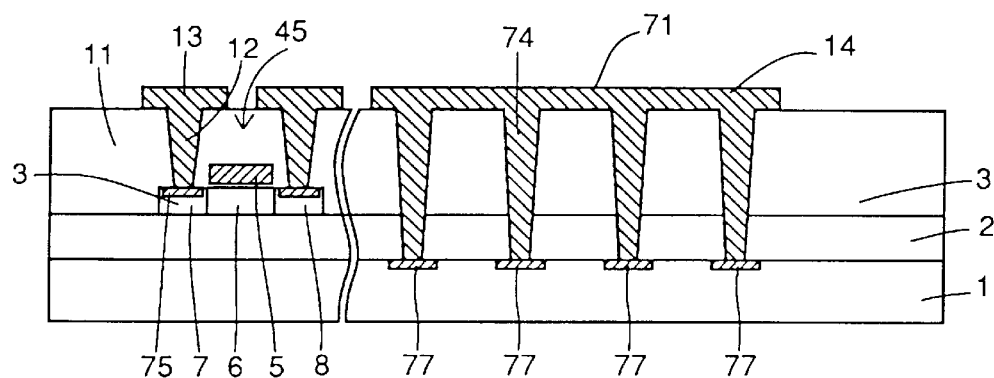
Figure 14:
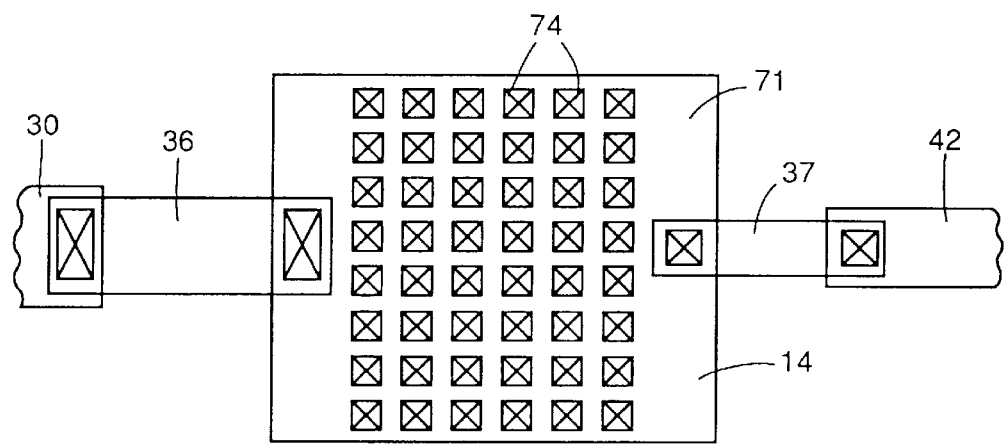
FIG. 14 is a plan showing a structure of an I/O protection circuit in FIG. 13.

FIG. 13 is a cross section showing structures of an internal circuit and an I/O protection circuit of an embodiment 7 of the invention. FIG. 14 is a plan showing an I/O protection circuit shown in FIG. 13.

As shown in FIG. 13, the internal circuit includes an N-channel MOS transistor 45 formed on buried oxide film 2. N-channel MOS transistor 45 is formed of silicon thin film 3 formed on buried oxide film 2, a gate insulating film formed on silicon thin film 3 and a gate electrode 5 formed on the gate insulating film. Silicon thin film 3 is formed of p$^-$-type substrate region 6 n-type drain region 7 and n-type source region 8. N-channel MOS transistor 45 is covered with interlayer insulating film 11. Interlayer insulating film 11 is provided with contact holes 12 located above drain region 7 and source region 8. Each of drain and source regions 7 and 8 is provided with an n$^+$-type contact region 75 which is heavily doped with n-type impurity. Aluminum interconnections 13 formed on interlayer insulating film 11 are in contact with contact regions 75 in drain and source regions 7 and 8 through contact holes 12, respectively.

Meanwhile, the I/O protection circuit shown in FIGS. 13 and 14 is not provided with silicon thin film 3. Alternatively, the I/O protection circuit is provided with a plurality of contact holes 74, which are arranged in a matrix form and extend through interlayer insulating film 11 and buried oxide film 2 to p-type silicon substrate. A plurality of n$^+$-type contact regions 77 which are heavily doped with n-type impurity are formed at portions of silicon substrate 1 under contact holes 74. Therefore, p-type silicon substrate 1 and the plurality of n$^+$-type contact regions 77 form a plurality of diodes. Signal line 71 forming aluminum interconnection 14 formed on interlayer insulating film 11 is in contact with contact regions 77 through contact holes 74, respectively.

Signal line 71 is connected to input terminal 30 via input resistance 36, and is connected to the internal circuit via internal resistance 37. Silicon substrate 1 is grounded. Therefore, the I/O protection circuit includes a diode connected between signal line 71 and the ground node, input resistance 36 and internal resistance 37.

In the manufacturing process, contact holes 12 and 74 are formed simultaneously in interlayer insulating film 11. Contact regions 75 and 77 are simultaneously formed by introduction of n-type impurity after contact holes 12 and 74 are formed. Further, aluminum interconnections 13 and 14 are formed simultaneously on interlayer insulating film 11.

In the I/O protection circuit thus formed and having the above structure, when a positive high voltage surge is applied from I/O terminal 30 to signal line 71 via input resistance 36, a p-n junction formed of silicon substrate 1 and contact region 77 breaks down, so that the surge is discharged to silicon substrate 1.

According to this embodiment 7, silicon substrate 1 is used as the anode region of the diode, so that an area occupied by the diode is small. Further, the diode does not have a gate electrode, so that insulating properties of the gate insulating film are not destroyed. Consequently, the surge resistance does not decrease.

[Embodiment 8]

Figure 15:
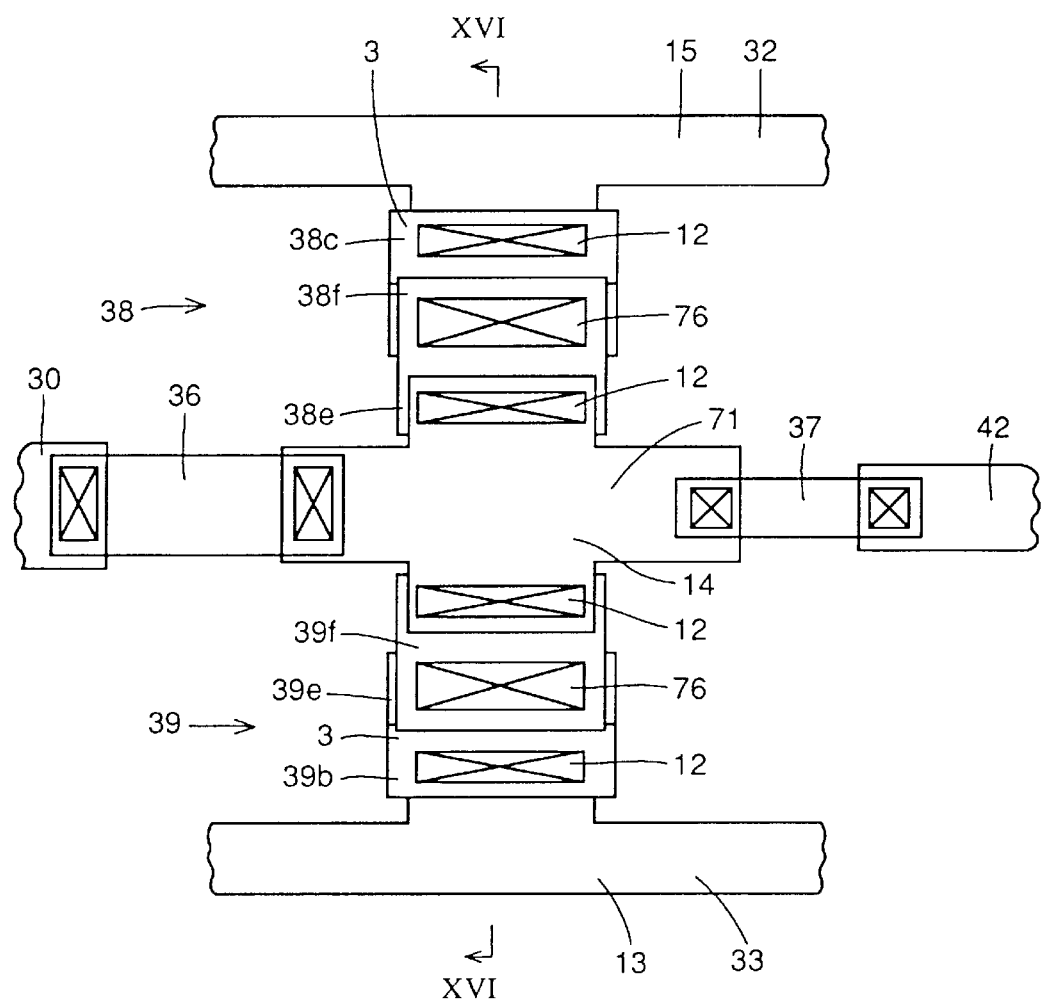
FIG. 15 is a plan showing a structure of an I/O protection circuit of an embodiment 8 of the invention.
Figure 16:
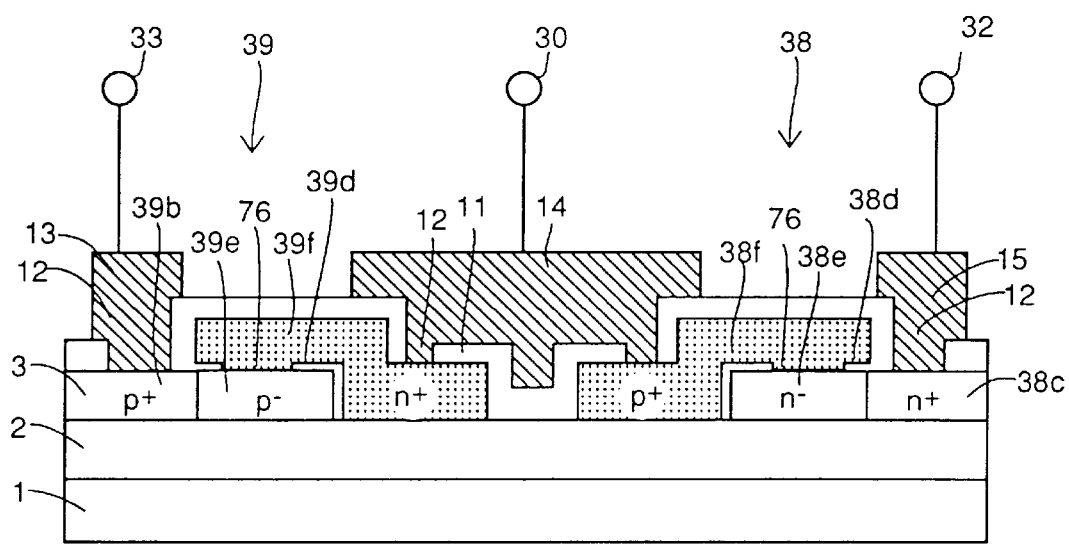
FIG. 16 is a cross section taken along line XVI—XVI in FIG. 15.

FIG. 15 is a plan showing a structure of the I/O protection circuit of an embodiment 8 of the invention. FIG. 16 is a cross section taken along line XVI—XVI in FIG. 15.

As shown in FIGS. 15 and 16, this I/O protection circuit differs from the structure shown in FIG. 5 in that anode region 38f is in contact with cathode region 38e through a contact hole 76 formed at gate insulating film 38d, and that a cathode region 39f is in contact with anode region 39e through contact hole 76 formed at gate insulating film 39d. More specifically, gate insulating films 38d and 39d cover cathode region 38e and anode region 39e. Gate insulating films 38d and 39d on cathode region 38e and anode region 39e are provided with contact holes 76. Anode region 38f is formed on gate insulating film 38d and buried oxide film 2. Anode region 38f is in contact with cathode region 38e through contact hole 76. Also, cathode region 39f is formed on gate insulating film 39d and buried oxide film 2. Cathode region 39f is in contact with anode region 39e through contact hole 76.

Cathode region 38e is doped with n-type impurity at about $1\times10^{17}/cm^3$. Anode region 38f is made of $p^+$-type polycrystalline silicon doped with p-type impurity at $1\times10^{20}/cm^3$. Anode region 39e is doped with p-type impurity at about $1\times10^{17}/cm^3$. Cathode region 39f is made of an $n^-$-type polycrystalline silicon film doped with n-type impurity at about $1\times10^{20}/cm^3$. Therefore, anode region 38f and cathode region 38e form a diode connected between input terminal 30 and power supply line 32. Anode region 39e and cathode region 39f form a diode connected between ground line 33 and input terminal 30. An equivalent circuit of the I/O protection circuit thus constructed is the same as that shown in FIG. 4.

According to the embodiment 8, since the diode for surge discharging does not have a gate electrode, the insulating properties of gate insulating films 38d and 39d are not destroyed, so that the surge resistance does not decrease.

[Other Embodiments]

In the embodiments described above, transistors or diodes are arranged at opposite sides of each of the power supply line and the ground line. However, the transistors or diodes may be arranged at only one side. Diode-coupled N-channel MOS transistors may be arranged at the power supply line side, and diode-coupled P-channel MOS transistors may be arranged at the ground line side. The I/O protection circuit may be formed of a combination of transistors and diodes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An I/O protection circuit formed on an insulating layer and connected between a terminal and an internal circuit including a plurality of MOS transistors, said I/O protection circuit comprising a first MOS element including:
   a first semiconductor film formed on said insulating layer and connected between said terminal and a first power supply line;
   a first gate insulating film formed on said first semiconductor film;
   a first floating gate electrode formed on said first gate insulating film;
   said first semiconductor film including:
      a substrate region of a first conductivity type located under said first floating gate electrode;
      a first conductive region of a second conductivity type neighboring to one side of said substrate region and connected to said first power supply line; and
      a second conductive region of the second conductivity type neighboring to the other side of said substrate region and connected to said terminal; wherein
   said plurality of MOS transistors include a substrate region having a first impurity concentration, and
   said substrate region of said first MOS element has a second impurity concentration higher than said first impurity concentration.

2. The I/O protection circuit according to claim 1, wherein said first semiconductor film includes:
   a substrate region of a first conductivity type located under said first gate electrode;
   a first conductive region of a second conductivity type neighboring to one side of said substrate region and connected to said first power supply line; and
   a second conductive region of the second conductivity type neighboring to the other side of said substrate region and connected to said terminal.

3. The I/O protection circuit according to claim 2, wherein said substrate region of said first MOS element is floated.

4. An I/O protection circuit formed on an insulating layer and connected between a terminal and an internal circuit including a plurality of MOS transistors, said I/O protection circuit comprising a first MOS element including:
   a first semiconductor film formed on said insulating layer and connected between said terminal and a first power supply line;
   a first gate insulating film formed on said first semiconductor film;
   a first floating gate electrode formed on said first gate insulating film;
   said first semiconductor film including:
      a substrate region of a first conductivity type located under said first floating gate electrode;
      a first conductive region of a second conductivity type neighboring to one side of said substrate region and connected to said first power supply line; and
      a second conductive region of the second conductivity type neighboring to the other side of said substrate region and connected to said terminal; wherein
   said plurality of MOS transistors are of the second conductivity type, and have gate electrodes made of polycrystalline silicon of the second conductivity type, and
   said first gate electrode of said first MOS element is made of polycrystalline silicon of the first conductivity type.

5. An I/O protection circuit formed on an insulating layer and connected between a terminal and an internal circuit including a plurality of MOS transistors, said I/O protection circuit comprising a first MOS element including:
   a first semiconductor film formed on said insulating layer and connected between said terminal and a first power supply line;
   a first gate insulating film formed on said first semiconductor film; and
   a first floating gate electrode formed on said first gate insulating film; wherein
   said first semiconductor film includes:
      a first conductive region of the first conductivity type located under said first gate electrode,
      a second conductive region of the first conductivity type neighboring to one side of said first conductive region and connected to said first power supply line, and
      a third conductive region of the second conductivity type neighboring to the other side of said first conductive region and connected to said terminal.

6. The I/O protection circuit according to claim 5, wherein said plurality of MOS transistors include a substrate region having a first impurity concentration, and
   said first conductive region of said first MOS element has a second impurity concentration higher than said first impurity concentration.

7. The I/O protection circuit according to claim 5, wherein said plurality of MOS transistors are of the second conductivity type, and have gate electrodes made of polycrystalline silicon of the second conductivity type, and
   said first gate electrode of said first MOS element is made of polycrystalline silicon of the first conductivity type.

8. An I/O protection circuit formed on an insulating layer and connected between a terminal and an internal circuit including a plurality of MOS transistors isolated from each other by a field shield method, and said I/O protection circuit comprising an MOS element including:
   a semiconductor film formed on said insulating layer and connected between said terminal and a power supply line;
   a gate insulating film formed on said semiconductor film; and
   a gate electrode formed on said gate insulating film and in the same layer as a gate electrode provided for a field shield method.

9. The I/O protection circuit according to claim 8, wherein said semiconductor film includes:
   a substrate region of a first conductivity type located under said gate electrode;
   a first conductive region of a second conductivity type neighboring to one side of said substrate region and connected to said power supply line; and
   a second conductive region of the second conductivity type neighboring to the other side of said substrate region and connected to said terminal.

10. The I/O protection circuit according to claim 9, wherein
   said plurality of MOS transistors include a substrate region having a first impurity concentration, and
   said substrate region of said MOS element has a second impurity concentration higher than said first impurity concentration.

11. The I/O protection circuit according to claim 9, wherein
   said substrate region of said MOS element is floated.

12. The I/O protection circuit according to claim 9, wherein
   said plurality of MOS transistors are of the second conductivity type, and have gate electrodes made of polycrystalline silicon of the second conductivity type, and
   said gate electrode of said MOS element is made of polycrystalline silicon of the first conductivity type.

13. An I/O protection circuit formed on an insulating layer and connected between a terminal and an internal circuit, said I/O protection circuit comprising:
   a semiconductor film of a first conductivity type formed on said insulating layer;
   a plurality of first conductive regions of the first conductivity type formed in said semiconductor film and connected to said terminal; and
   a plurality of second conductive regions of a second conductivity type formed in said semiconductor film and connected to a power supply line.

14. The I/O protection circuit according to claim 13, wherein
   said first and second conductive regions are disposed in a matrix form, and are disposed alternately to each other in each of rows and columns in said matrix.

15. The I/O protection circuit according to claim 13, wherein
   round interfaces are formed between said semiconductor film and said first and second conductive regions.

16. An I/O protection circuit formed on an insulating layer and connected between a terminal and an internal circuit including a MOS transistor having a source/drain region connected to an interconnection through a first contact hole formed in an insulating film formed on said insulating layer, said I/O protection circuit comprising:
   a semiconductor substrate of a first conductivity type having a main surface on which said insulating layer is formed, said semiconductor substrate connected to a power supply node; and
   a conductive region of a second conductivity type formed at said main surface of said semiconductor substrate and connected to said terminal through a second contact hole formed in said insulating layer and said insulating film.

17. The I/O protection circuit according to claim 16, wherein
   said first conductivity type is p-type, and said power supply node is a ground node.

18. An I/O protection circuit formed on an insulating layer and connected between a terminal and an internal circuit, said I/O protection circuit comprising:
   a first conductive region of a first conductivity type formed on said insulating layer and connected to a first power supply line;
   a first insulating film formed on said first conductive region and having a first contact hole extending to said first conductive region; and
   a first conductive film of a second conductivity type formed on said first insulating film, in contact with said first conductive region through said first contact hole and connected to said terminal.

19. The I/O protection circuit according to claim 18, further comprising:
   a second conductive region of the second conductivity type formed on said insulating layer and connected to a second power supply line;
   a second insulating film formed on said second conductive region and having a second contact hole extending to said second conductive region; and
   a second conductive film of the first conductivity type formed on said second insulating film, in contact with said second conductive region through said second contact hole and connected to said terminal.

20. A protection circuit formed on an insulating layer and connected between a terminal and an internal circuit, said protection circuit comprising:
   a semiconductor film formed on said insulting layer;
   a plurality of first conductive regions of a first conductivity type formed in said semiconductor film and connected to said terminal; and
   a plurality of second conductive regions of a second conductivity type formed in said semiconductor film and connected to a power supply line, wherein
   said first and second conductive regions are disposed in a matrix form, and are disposed alternately to each other in each of rows and columns in said matrix.

21. A protection circuit formed on an insulating layer and connected between a terminal and an internal circuit, said protection circuit comprising:
   a semiconductor film formed on said insulating layer;
   a plurality of first conductive regions of a first conductivity type formed in said semiconductor film and connected to said terminal; and
   a plurality of second conductive regions of a second conductivity type formed in said semiconductor film and connected to a power supply line, wherein round iterfaces are formed between said semiconductor film and said first and second conductive regions.

* * * * *